United States Patent
Yonehara et al.

(10) Patent No.: US 7,029,950 B2
(45) Date of Patent: Apr. 18, 2006

(54) THIN-FILM SEMICONDUCTOR DEVICE AND METHOD OF MANUFACTURING THE SAME

(75) Inventors: Takao Yonehara, Kanagawa (JP); Kiyofumi Sakaguchi, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/100,605

(22) Filed: Apr. 7, 2005

(65) Prior Publication Data
US 2005/0202595 A1    Sep. 15, 2005

Related U.S. Application Data

(63) Continuation of application No. 10/059,144, filed on Jan. 31, 2002.

(30) Foreign Application Priority Data
Jan. 31, 2001   (JP) ................. 2001-023847

(51) Int. Cl.
*H01L 21/44* (2006.01)
(52) U.S. Cl. .................................. 438/113
(58) Field of Classification Search ........ 438/106–127, 438/460–465
See application file for complete search history.

(56) References Cited

U.S. PATENT DOCUMENTS

| | | | |
|---|---|---|---|
| 5,071,792 A | 12/1991 | VanVonno et al. | 437/227 |
| 5,158,818 A | 10/1992 | Aurichio | 428/40.7 |
| 5,206,749 A | 4/1993 | Zavracky et al. | 359/59 |
| 5,256,562 A | 10/1993 | Vu et al. | 437/86 |
| 5,597,766 A | 1/1997 | Neppl | 437/226 |
| 5,757,456 A | 5/1998 | Yamazaki et al. | 349/151 |
| 5,811,348 A | 9/1998 | Matsushita et al. | 438/455 |
| 5,856,229 A | 1/1999 | Sakaguchi et al. | 438/406 |
| 5,888,882 A | 3/1999 | Igel et al. | 438/460 |
| 5,985,742 A | 11/1999 | Henley et al. | 438/515 |
| 6,010,579 A | 1/2000 | Henley et al. | 148/33.2 |
| 6,017,804 A | 1/2000 | Freund et al. | 438/460 |
| 6,075,280 A | 6/2000 | Yung et al. | 257/620 |
| 6,107,213 A | 8/2000 | Tayanaka et al. | 438/762 |

(Continued)

FOREIGN PATENT DOCUMENTS

EP          0 603 973          6/1994

(Continued)

OTHER PUBLICATIONS

Shimoda, T., et al, "Surface Free Technology By Laser Annealing (SUFTLA)" International Electron Devices Meeting 1999. IEDM. Technical Digest. Washington, DC, Dec. 5 to 8, 1999, New York, NY: IEEE, US, Aug. 1, 1999, pp. 289 to 292, XP000933199 ISBN: 0-7803-5411-7.

*Primary Examiner*—Brook Kebede
(74) *Attorney, Agent, or Firm*—Fitzpatrick, Cella, Harper & Scinto

(57) ABSTRACT

A thin-film semiconductor device with a reduced influence on a device formation layer in separation and a method of manufacturing the device are provided. The manufacturing method includes the step of preparing a member having a semiconductor film with a semiconductor element and/or semiconductor integrated circuit on a separation layer, the separation step of separating the member at the separation layer by a pressure of a fluid, and the chip forming step of, after the separation step, forming the semiconductor film into chips.

12 Claims, 7 Drawing Sheets

U.S. PATENT DOCUMENTS

| | | | |
|---|---|---|---|
| 6,136,668 A | 10/2000 | Tamaki et al. | 438/462 |
| 6,171,965 B1 | 1/2001 | Kang et al. | 438/695 |
| 6,186,384 B1 | 2/2001 | Sawada | 225/2 |
| 6,190,937 B1 | 2/2001 | Nakagawa et al. | 438/67 |
| 6,222,513 B1 | 4/2001 | Howard et al. | 345/84 |
| 6,258,698 B1 | 7/2001 | Iwasaki et al. | 438/455 |
| 6,306,729 B1 | 10/2001 | Sakaguchi et al. | 438/458 |
| 6,331,208 B1 | 12/2001 | Nishida et al. | 117/89 |
| 6,342,433 B1 | 1/2002 | Ohmi et al. | 438/455 |
| 6,382,292 B1 | 5/2002 | Ohmi et al. | 156/584 |
| 6,455,398 B1 | 9/2002 | Fonstad et al. | 438/459 |
| 6,465,329 B1 | 10/2002 | Glenn | 438/462 |
| 6,475,323 B1 | 11/2002 | Ohmi et al. | 156/239 |
| 6,500,731 B1 | 12/2002 | Nakagawa et al. | 438/455 |
| 6,602,761 B1 | 8/2003 | Fukunaga | 438/459 |
| 6,627,487 B1 | 9/2003 | Zhang | 438/166 |
| 6,664,169 B1 | 12/2003 | Iwasaki et al. | 438/409 |
| 6,677,183 B1 * | 1/2004 | Sakaguchi et al. | 438/113 |
| 6,682,963 B1 | 1/2004 | Ishikawa | 438/149 |
| 6,682,990 B1 | 1/2004 | Iwane et al. | 438/458 |
| 6,713,851 B1 * | 3/2004 | Umehara et al. | 257/675 |
| 2002/0076904 A1 | 6/2002 | Imler | 438/462 |
| 2002/0100941 A1 | 8/2002 | Yonehara et al. | 257/359 |
| 2002/0102758 A1 | 8/2002 | Yonehara et al. | 349/43 |

FOREIGN PATENT DOCUMENTS

| | | |
|---|---|---|
| EP | 849 788 | 6/1998 |
| EP | 858 110 | 8/1998 |
| EP | 886 300 | 12/1998 |
| EP | 1 061 566 | 12/2000 |
| EP | 1 122 794 | 8/2001 |
| FR | 2 784 794 | 4/2000 |
| JP | 55-145354 | 11/1980 |
| JP | 9-312349 | 12/1997 |
| JP | 11-316397 | 11/1999 |
| JP | 11-317509 | 11/1999 |
| WO | 93/21663 | 10/1993 |
| WO | 00/63965 | 10/2000 |

* cited by examiner

THIN-FILM SEMICONDUCTOR DEVICE AND METHOD OF MANUFACTURING THE SAME

This application is a continuation application of application Ser. No. 10/059,144, filed Jan. 31, 2002.

FIELD OF THE INVENTION

The present invention relates to a thin-film semiconductor device and a method of manufacturing the same.

BACKGROUND OF THE INVENTION

For a thin LSI chip, a technique of forming an integrated circuit and the like on a silicon substrate and then thinning the resultant structure from the lower surface side of the substrate using a grinder is known.

However, the integrated circuit and the like are formed only on the upper surface of the silicon substrate. Most parts are ground and wasted. Such a technique does not allow effectively using limited resources.

On the other hand, along with micropatterning and an increase in degree of integration of semiconductor devices, the chip heat density may greatly increase. Hence, there is an urgent need of establishing a technique for thin LSI chips.

A normal semiconductor chip itself has no flexibility. If it is to be mounted on a thin device such as an IC card, the bending strength must be increased. This is because a portable device such as an IC card may receive a bending force when it is accommodated. Hence, an LSI chip and the like which are mounted on a thin device must be thin from the viewpoint of heat dissipation and mechanical flexibility.

Japanese Patent Laid-Open No. 9-312349 describes a technique for a flexible LSI chip using separation by a porous layer.

More specifically, as shown in FIG. 6A, a device formation layer 10 is formed on a semiconductor substrate 11 via a porous layer 12. The device formation layer and holding substrate 16 are bonded via an adhesive 17. After that, an external force in a direction in which the semiconductor substrate 11 and holding substrate 16 are separated from each other is applied between the semiconductor substrate 11 and the holding substrate 16. Then, separation occurs at the mechanically weak porous layer 12, and the device formation layer 10 separates from the semiconductor substrate 11 together with the holding substrate 16 (FIG. 6B).

Next, a dicing film 18 that stretches when pulled in the planar direction is jointed to the rigid holding substrate 16 side. Dicing is performed using a dicing apparatus to form a kerf 19 from the device formation layer side (FIG. 6C). After that, the dicing film is stretched in the planar direction to separate chips. Thus, thin LSI chips are completed.

However, in the above thin LSI chip forming technique, since the separation step is executed using an external force, i.e., a tensile force, a strain may be partially locally applied to the semiconductor element and/or semiconductor integrated circuit which is formed in advance to adversely affect the device characteristics.

SUMMARY OF THE INVENTION

The present invention has been made in consideration of the above situation, and has as its object to provide a thin-film semiconductor device manufacturing method with a reduced influence on a device formation layer in separation and a thin-film semiconductor device that can be formed by the method.

It is another object of the present invention to improve device characteristics and, more particularly, element isolation characteristics by forming a thin device formation layer.

According to an aspect of the present invention, there is provided a method of manufacturing a thin-film semiconductor device, comprising the step of preparing a member having a semiconductor film with a semiconductor element and/or semiconductor integrated circuit on a separation layer, the separation step of separating the member at the separation layer by a pressure of a fluid, and the chip forming step of, after the separation step, forming the semiconductor film into chips.

According to the present invention, since the member is separated by the pressure of the fluid, local stress applied to the semiconductor element or the like in separation can be avoided.

The member may be a member obtained by forming a porous layer on a surface of a semiconductor substrate, forming the semiconductor film on a surface of the porous layer, and then forming the semiconductor element and/or semiconductor integrated circuit, or a member obtained by forming the semiconductor element and/or semiconductor integrated circuit on a surface of a semiconductor substrate and implanting ions from the surface side to a predetermined depth to form the separation layer.

After the separation step, the separation layer remaining on the semiconductor film side may be removed, and then, the chip forming step may be executed. Alternatively, after the separation step and the chip forming step, the step of removing the separation layer remaining on the semiconductor film side may be executed.

According to another aspect of the present invention, there is provided a method of manufacturing a thin-film semiconductor device, comprising the step of preparing a member having a semiconductor film with a semiconductor element and/or semiconductor integrated circuit on a separation layer, the chip forming step of forming the member into chips in desired regions, and the separation step of, after the chip forming step, separating the member at the separation layer.

When the member is separated after the chip forming step, a thin-film device can be formed by separation at the separation layer only for a non-defective chip. Hence, the member can be efficiently separated independently of the wafer area.

According to still another aspect of the present invention, there is provided a thin-film semiconductor device obtaining by processing a member having a semiconductor film with a semiconductor element and/or semiconductor integrated circuit on a separation layer, the process comprising the separation step of separating the member at the separation layer by a pressure of a fluid, and the chip forming step of, after the separation step, forming the semiconductor film into chips.

According to still another aspect of the present invention, there is provided a thin-film semiconductor device obtaining by processing a member having a semiconductor film with a semiconductor element and/or semiconductor integrated circuit on a separation layer, the process comprising the chip forming step of forming the member into chips in desired regions, and the separation step of, after the chip forming step, separating the member at the separation layer.

Other features and advantages of the present invention will be apparent from the following description taken in

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS (First Embodiment)

The first embodiment of the present invention will be described with reference to FIGS. 1A to 1G.

Figure 1A:
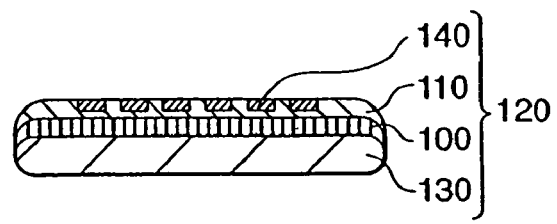
FIGS. 1A to 1G are schematic sectional views showing an embodiment of the present invention.

First, as shown in FIG. 1A, a member 120 having a semiconductor film 110 with semiconductor elements and/or semiconductor integrated circuits 140 on a semiconductor region 130 via a separation layer 100 is prepared. A method of forming the semiconductor elements and/or semiconductor integrated circuits 140 on the semiconductor film 110 will be described later.

The member 120 is separated at the separation layer 100. More specifically, a pressure by a fluid is applied to the side surface of the separation layer 100. To apply a pressure, preferably, a fluid formed from a liquid or gas is injected to the side surface of the separation layer 100 as high-pressure jet, or a static pressure is applied to the separation layer 100.

Figure 1B:
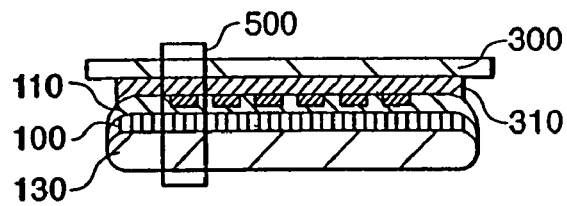

In separation, the member 120 may be bonded to a support member 300 via an adhesive layer 310 (FIG. 1B). The step of bonding the member to the support member 300 may be omitted. As the adhesive layer, an epoxy-based adhesive or another adhesive can be used.

Figure 1C:
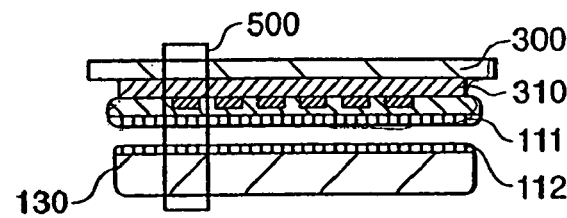
Figure 1D:
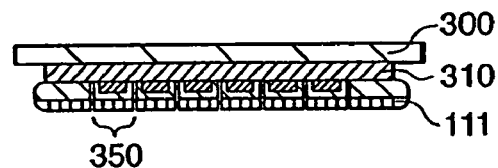
Figure 1E:
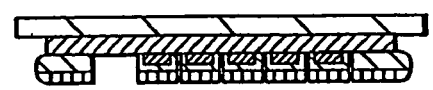

Thus, the member 120 is separated at the separation layer 100 (FIG. 1C).

Next, the separation layer 100 is partitioned to desired semiconductor elements and/or semiconductor integrated circuits by kerfs to form chips (FIG. 1D), thereby obtaining one or a plurality of thin-film semiconductor devices 350. The bottom surface of kerf in FIG. 1D need not always reach the adhesive layer 310. For example, the support member 300 is made of a stretchable material. In this case, even when the semiconductor film 110 is not completely separated, the chips can be extracted by stretching the support member 300.

In some cases, portions 111 of the separation layer 100 remain on the thin-film semiconductor devices 350. After the separation step and before the chip formation step, the remaining portions 111 may be removed by polishing, grinding, or etching. Instead of polishing or the like, annealing in an atmosphere containing hydrogen may be executed. After the chip formation step, the remaining portions 111 on the bottom surfaces of the thin-film semiconductor devices 350 may be, e.g., individually removed.

Figure 1F:
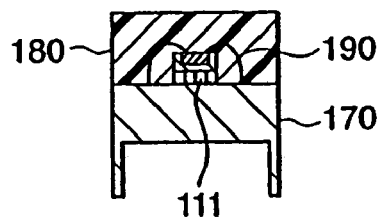
Figure 1G:

After chip formation, connection to another circuit or packaging becomes possible. Packaging may be executed while leaving the remaining portions. That is, the thin-film semiconductor device 350 can be mounted on a support substrate 170 via the remaining separation layer 111, as shown in FIG. 1F, or can be transferred onto a plastic card, as shown in FIG. 1G. Reference numeral 180 denotes a sealing resin; 190, a wire; 200, a sealing resin/film; and 210, a plastic card. Since the remaining separation layer can serve as a gettering site, the resistance against metal contamination during the processes increases.

FIGS. 4A to 4H are enlarged views of a region 500 in FIG. 1B and regions related to it.

Figure 4A:
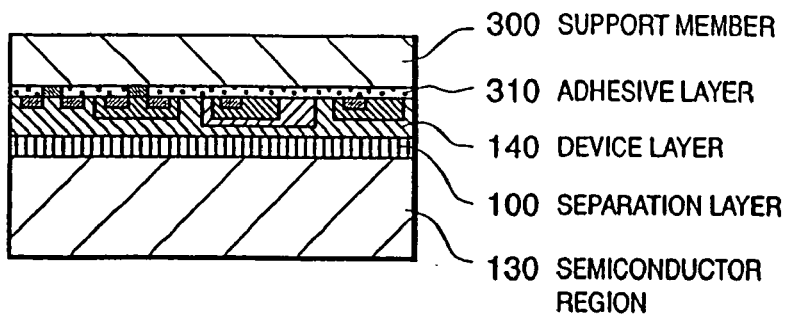
FIGS. 4A to 4H are schematic sectional views showing an example of the embodiment of the present invention.
Figure 4B:
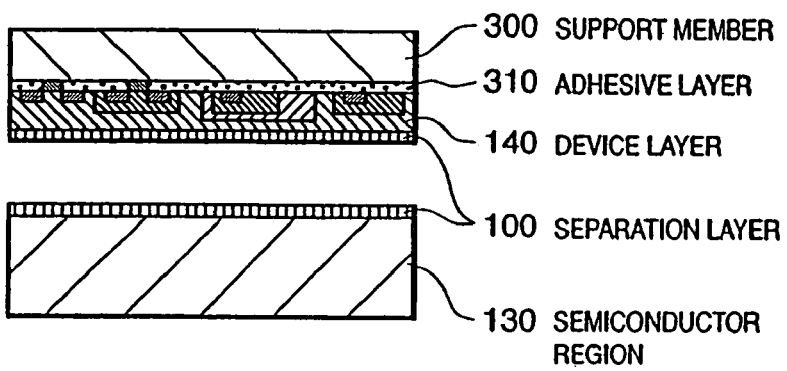
Figure 4C:
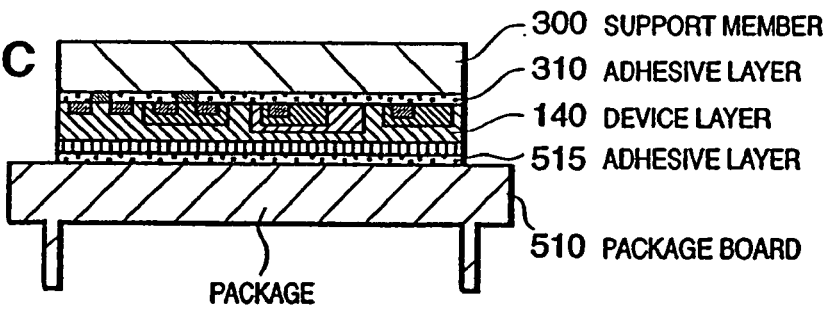
Figure 4D:
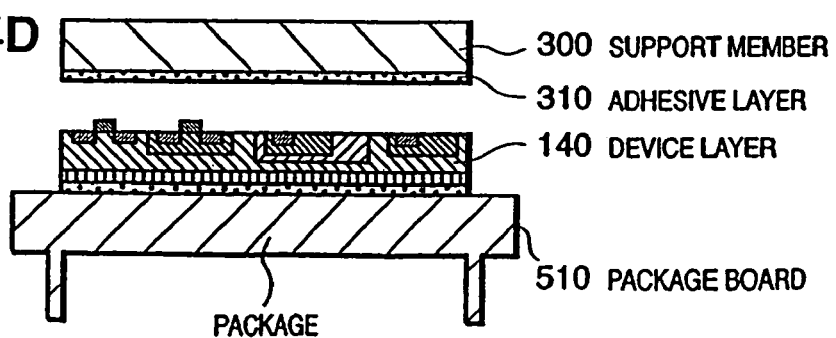

FIG. 4A shows a state wherein the device layer 140 and support member 300 are bonded via the adhesive layer 310. FIG. 4B shows a state wherein separation was performed at the separation layer 100. FIG. 4C shows a state wherein the structure formed by bonding the support member 300 and device layer 140 is mounted on a package board 510. Reference numeral 515 denotes an adhesive layer. FIG. 4D shows a state wherein the semiconductor element and/or semiconductor integrated circuit 140 is separated from the support member 300. When kerfs reaching the support member 300 are formed at the time of chip formation in FIG. 1D, the thin-film semiconductor device can be placed on the package board 510 while keeping the device layer 140 bonded to the support member 300, and after that, the support member 300 can be removed in the steps shown in FIGS. 4C and 4D.

Figure 4E:
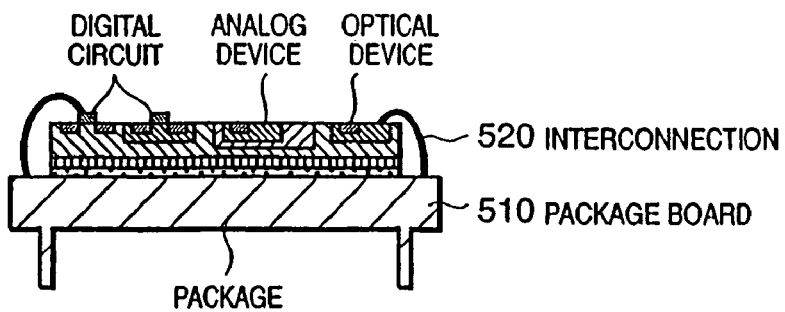
Figure 4F:
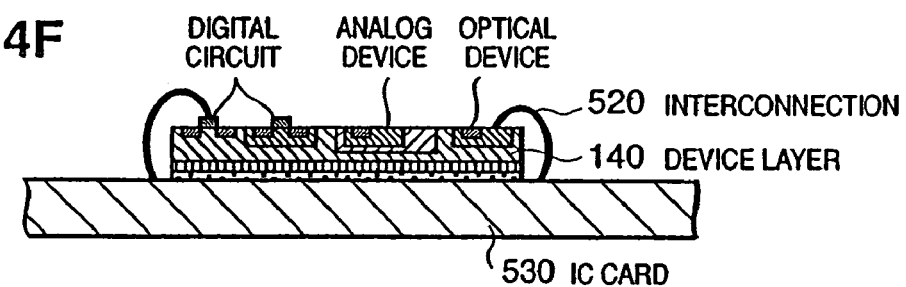
Figure 4G:
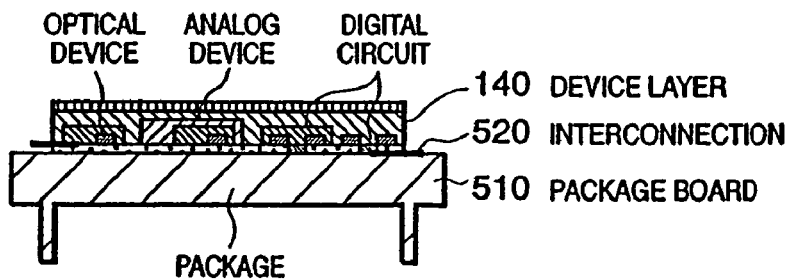
Figure 4H:
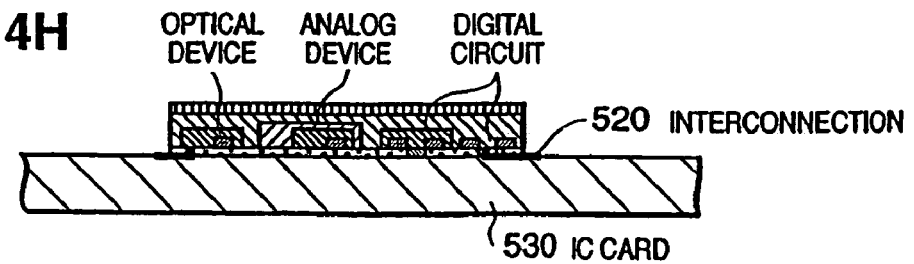

FIG. 4E shows a detailed example of a structure obtained by connecting the package board 510 and device layer by an interconnection 520. FIG. 4F shows an example in which the device is mounted on an IC card 530. In FIGS. 4E and 4F, an opposite side of the device layer 140 is bonded to the package board as a bonding surface. Instead, the device layer 140 side may be bonded to the package board as a bonding surface, as shown in FIGS. 4G and 4H.

(Member, Separation Layer)

To form the member 120, a method using a porous layer formed by anodizing or a method using an ion-implanted layer formed by implanting ions of hydrogen, nitrogen, or a rare gas such as helium is mainly used.

In the former method, first, a silicon substrate is anodized to form the porous layer 100 functioning as a separation layer on the surface. After the semiconductor film 110 is formed on the porous layer by CVD or the like, a semiconductor element and/or semiconductor integrated circuit is formed on the semiconductor film 110 by a normal semiconductor manufacturing process. Thus, the member 120 is obtained.

In the latter method, a semiconductor element and/or semiconductor integrated circuit is formed on the surface of a silicon substrate (or epitaxial wafer). After a protective film is formed on the surface of the element or the like as needed, hydrogen ions are implanted to a desired depth to form an ion-implanted layer functioning as a separation layer. Thus, the member 120 is obtained. A device may be formed in a region on the substrate surface side after the ion-implanted layer is formed at a predetermined depth from the silicon substrate surface. If the dose is large, a separation phenomenon may occur during the device forming process. Hence, the dose is reduced (and annealing is then performed as needed) for design not to cause separation during the device forming process.

When a porous layer is to be formed using anodizing, a plurality of porous layers having different porosities may be formed. For example, a two-layered structure including a high-porosity layer and low-porosity layer from the semiconductor region 130 side may be formed. Alternatively, a three-layered structure including a first low-porosity layer, high-porosity layer, and second low-porosity layer from the semiconductor region 130 side may be formed. The porosity of a high-porosity layer can be 10% to 90%. The porosity of a low-porosity layer can be 0% to 70%. To form a plurality of layers having different porosities, the current density in anodizing is changed, or the type or concentration of an anodizing solution is changed.

When a porous layer is formed by anodizing, a protective film forming process of forming a protective film such as a nitride film or oxide film on the inner walls of pores in the porous layer or an annealing process in an atmosphere containing hydrogen is preferably performed before growing the semiconductor film 110 on the porous layer. It is also preferable to execute the annealing process after the protective film forming process.

When the semiconductor film 110 is to be grown by CVD, the semiconductor film 110 is preferably slowly grown at 20 nm/min or less to a predetermined thickness (e.g., 10 nm).

(Semiconductor Film)

As the semiconductor film 110, a non-porous single-crystal silicon thin film or a compound semiconductor film such as a GaAs, InP, or GaN film can be used. When the semiconductor film is made of single-crystal silicon, $SiH_2Cl_2$, $SiHCl_3$, $SiCl_4$, $SiH_4$, or HCl gas may be added as a source gas. The forming method is not limited to CVD, and MBE or sputtering can also be used.

After the porous layer is subjected to first annealing in an atmosphere containing hydrogen, second annealing is preferably executed at a temperature higher than that for the first annealing before the thin film is grown. The first annealing temperature can be 800° C. to 1,000° C., and the second annealing temperature can be 900° C. to melting point. With this process, pores on the surface of the porous layer can be sufficiently sealed. For example, the first annealing may be executed at 950° C., and the second annealing may be executed at 1,100° C.

(Member)

As the member 120, not only a single-crystal silicon wafer prepared by the CZ method, MCZ method, or FZ method but also a wafer having a substrate surface annealed in hydrogen or epitaxial silicon wafer can also be used. Not only silicon but also a compound semiconductor substrate such as a GaAs substrate or InP substrate can be used.

(Semiconductor Element and/or Semiconductor Integrated Circuit)

As the semiconductor element and/or semiconductor integrated circuit 140, an element such as a CMOS, bipolar transistor, diode, coil, or capacitor, or a semiconductor integrated circuit such as a DRAM, microprocessor, logic IC, or memory can be formed. The application purposes of the element or circuit include an electronic circuit, oscillation circuit, light receiving/emitting element, optical waveguide, and various sensors.

A trench or LOCOS (local oxidation) portion used for element isolation is also preferably made to reach the porous layer.

Portions between the prospective separated chips may be subjected to LOCOS or mesa etching to remove the semiconductor film between the chips.

(Separation)

For separation, a fluid such as a liquid or gas, i.e., high-pressure fluid jet is injected to the side surface of the separation layer.

As a fluid, a liquid such as water, an etchant, or alcohol, or a gas such as air, nitrogen gas, or argon gas can be used. An ultrasonic vibration may be applied in separation.

For separation, if the porous layer or ion-implanted layer serving as a separation layer is not exposed to the side surface of the member, the porous layer may be exposed.

For separation under a static pressure (under the pressure of a fluid that substantially stands still), for example, the following pressure application mechanism is necessary.

That is, a closed space forming member for forming a closed space by surrounding at least part of the peripheral portion of the member, and a pressure application mechanism capable of applying a pressure higher than that of the external space into the closed space are required.

Especially when the separation layer is formed by implanting hydrogen ions, nitrogen ions, He ions, or rare gas ions, and the resultant structure is annealed at about 400° C. to 600° C., a microcavity layer (microbubble layer) formed by ion implantation coagulates. A chip may be separated using this phenomenon in addition to a pressure by a fluid. The structure may be heated by a $CO_2$ laser or the like.

To form chips from the separation layer side, a normal dicing apparatus can be used. Alternatively, etching, laser abrasion, ultrasonic cutter, or high-pressure jet (e.g., water jet) can be used. For etching, $HF+H_2O_2$, $HF+HNO_3$, or an alkali solution can be used as an etchant. Examples of the laser are a YAG laser, $CO_2$ laser, and excimer laser.

(Second Embodiment)

The second embodiment of the present invention will be described next with reference to FIGS. 2A to 2F.

Figure 2A:
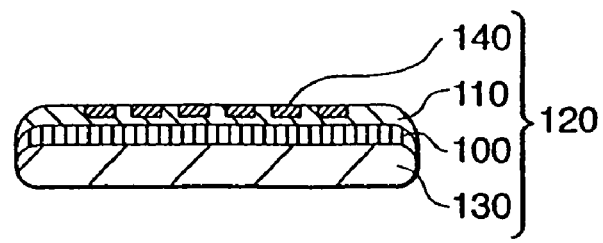
FIGS. 2A to 2F are schematic sectional views showing another embodiment of the present invention.

As in the first embodiment, a member 120 having a semiconductor film 110 with semiconductor elements and/or semiconductor integrated circuits 140 on a semiconductor region 130 via a separation layer 100 is prepared. (FIG. 2A).

Figure 2B:
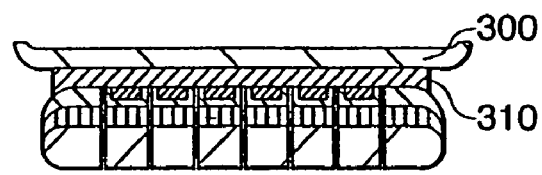

The member 120 is bonded to a support member 300 via an adhesive layer 310, as needed (FIG. 2B).

Figure 2C:
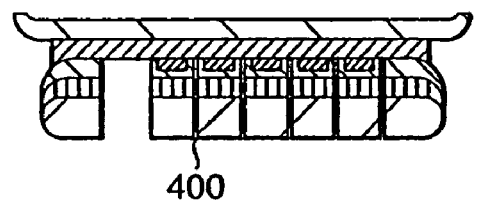

Next, kerfs 400 are formed in the member 120 from the semiconductor region 130 side to separate the member into desired semiconductor elements and/or semiconductor integrated circuits, thereby forming chips (FIG. 2B). The bottom surface of each kerf preferably reaches a portion near the interface between the semiconductor film 110 and the support member 300 or a portion near the adhesive layer 310. A small semiconductor region 500 formed as a chip is separated from the member 120 (FIG. 2C). Thus, a thin-film semiconductor device is manufactured.

Figure 2D:
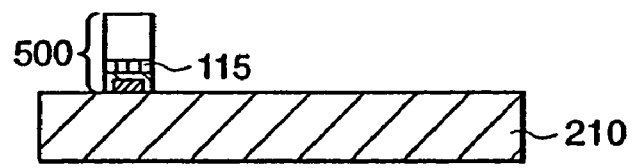
Figure 2E:
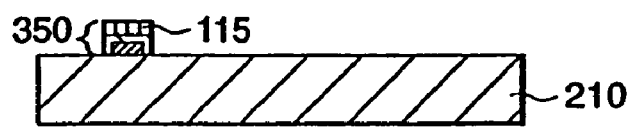
Figure 2F:
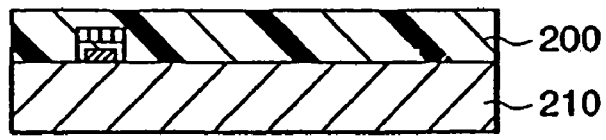
Figure 3A:
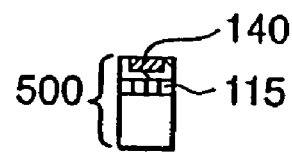
FIGS. 3A to 3D are schematic sectional views showing an example of the embodiment of the present invention.
Figure 3B:
Figure 3C:
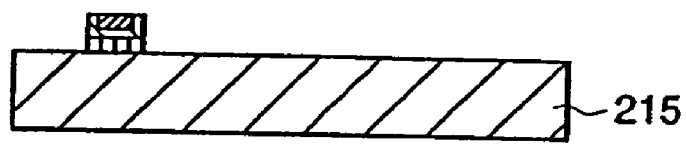
Figure 3D:
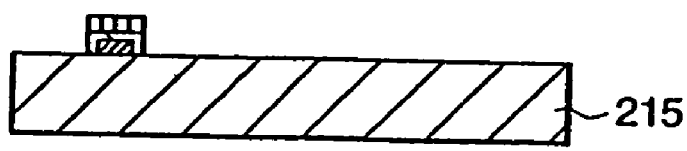

FIGS. 2D to 2F show an example of a method of packaging the thin-film semiconductor device 500. As shown in FIG. 2D, the small semiconductor region 500 is mounted on a plastic card. After the small semiconductor region 500 is separated at a separation layer 115, the resultant structure is sealed by a resin 200. The packaging method is not limited to this. After the chip forming step, the small semiconductor region 500 may be extracted, as shown in FIG. 3A, separated by forming a crack in the planar direction in the separation layer 115 (FIG. 3B), and mounted on a substrate 215. In this case, the semiconductor element side may face upward, as shown in FIG. 3C, or may be used as a bonding surface, as shown in FIG. 3D.

The separation step is executed after a chip is formed, i.e., after the separation area is largely decreased as compared to the entire silicon wafer. Hence, an external force such as a tensile force, compression force, or shearing force may be used. Preferably, the region is separated using the above-described fluid. The region may be separated by heating the separation layer 115. Especially, when the separation layer is formed from an ion-implanted layer of hydrogen or the like, the separation layer is also preferably locally heated using a laser or the like.

The description in the above first embodiment directly applies to the separation layer, semiconductor film, member, and semiconductor element and/or semiconductor integrated circuit.

When the separation step is executed after the chip forming step, as in this embodiment, local stress concentration to a semiconductor element can be reduced as compared to a case wherein a large-area portion is separated at once. Additionally, when only non-defective chips are separated, the yield can be improved.

EXAMPLE 1

A p-type single-crystal Si substrate having a resistivity of 0.01 Ω·cm was prepared. The substrate surface was anodized in an HF solution. The anodizing conditions were Current density: 7 (mA·cm$^{-2}$)
Anodizing solution: HF:$H_2O$:$C_2H_5OH$=1:1:1
Time: 11 (min)
Thickness of porous Si layer: 12 (μm)

The porosity of the porous Si layer was adjusted such that a high-quality epitaxial Si layer could be formed on the porous Si layer and the porous Si layer could be used as a separation layer. More specifically, the porosity was 20%. The thickness of the porous Si layer is not limited to the above thickness and may be several hundred μm to 0.1 μm. The type of the single-crystal Si substrate is not limited to the p type and may be n type. The resistivity of the substrate is not limited to the particular value. The substrate typically has a resistivity ranging from 0.001 to 50 Ω·cm, preferably from 0.005 to 1 Ω·cm, and more preferably from 0.005 to 0.1 Ω·m.

This single-crystal Si substrate was oxidized in an oxygen atmosphere at 400° C. for 1 hr. The inner walls of pores in the porous Si layer were covered with a thermal oxide film. After that, the surface of the porous Si layer was dipped in hydrofluoric acid to remove only the oxide film on the surface of the porous Si layer while leaving the oxide film on the inner walls of the pores. Next, a 3-μm thick single-crystal Si layer was epitaxially grown on the porous Si layer by CVD (Chemical Vapor Deposition). The growth conditions were Source gas: $SiH_2Cl_2$/$H_2$
Gas flow rate: 0.5/180 l/min
Gas pressure: 80 Torr
Temperature: 950° C.
Growth rate: 0.3 μm/min The single-crystal Si layer may be grown on the porous Si layer to have a thickness ranging from several nm to several hundred μm in accordance with applications or devices to be manufactured.

Before the epitaxial growth, annealing was executed in an atmosphere containing hydrogen. The purpose was to seal surface pores. In addition to this annealing, small Si atoms may be added by a source gas or the like to compensate for atoms for surface pore sealing.

A resultant member can be handled as a wafer that is identical to a normal epitaxial wafer. Only a different point is that the porous Si layer is formed under the epitaxial layer. A circuit such as a microprocessor, logic IC, or memory was formed on the epitaxial layer. With the same processes as in normal manufacturing, an LSI having performance identical to a conventional LSI could be formed. After epitaxial growth and before device region formation, it is also preferable to anneal the structure in a hydrogen atmosphere.

A Si region of the porous Si layer is depleted and has a high resistance. With this structure, high-speed operation and low power consumption of a device can be realized as if an SOI were used.

When a trench is used for element isolation, the chip area can be reduced, and the number of chips available from a wafer increases. When a trench or LOCOS reached the porous Si layer, insulation between elements could be achieved as well as the high resistance of the porous Si layer.

The thus formed LSI is normally subjected to lower-surface grinding and chip formation by dicing. In Example 1, the entire wafer was separated into the substrate side and LSI side at a porous Si layer formed in advance.

For separation, a fluid pressure was used. More specifically, separation was performed by injecting high-pressure water jet to the side surface of the porous Si layer.

As a fluid, for example, a gas, a liquid, or a gas or liquid containing solid granules or powder can preferably be used. In Example 1, water jet (to be referred to as "WJ" hereinafter) was used. Alternatively, air-jet, nitrogen gas jet or another gas jet, liquid jet except water, liquid jet containing ice or plastic pieces or abrasives, or a static pressure thereof may be applied. As a characteristic feature of a fluid, it can enter a very small gap to increase the internal pressure and also distribute the external pressure. As another characteristic feature, since no excessive pressure is partially applied, a portion that is most readily separated can be selectively separated. This is an optimum means for separating the entire thin layer on which semiconductor devices have already been formed, as in the present invention.

In separation, the surface side is preferably supported by another support member. For example, a flexible sheet, glass substrate, plastic substrate, metal substrate, or another semi-conductor substrate can be used. Such a support member is bonded to the device formation surface side of the substrate with an adhesive.

A fluid was applied to a portion near the edge of the first substrate supported by the support member to separate the entire porous Si layer. In applying a fluid, the porous Si layer is preferably exposed to the edge of the first substrate. When the porous Si portion having a concave portion is exposed, a fluid pressure can be more efficiently applied to the porous Si layer.

The porous Si remaining on the device layer side may be removed or not.

Figure 5A:
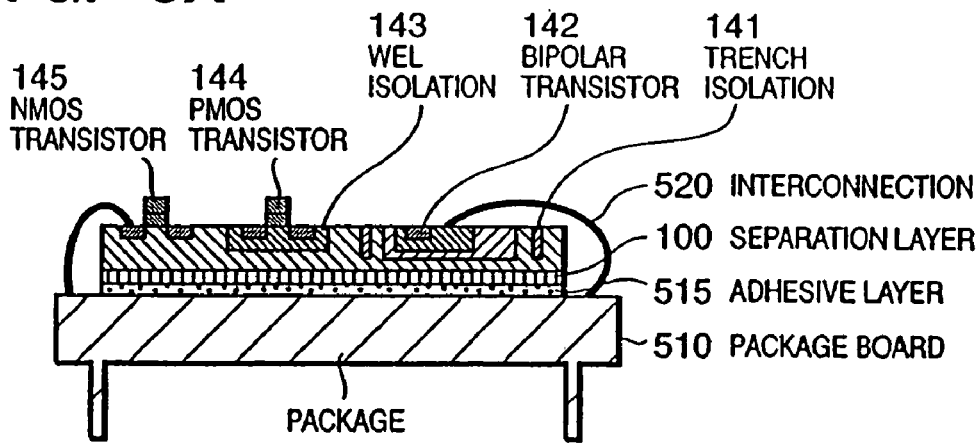
FIGS. 5A to 5C are schematic sectional views showing an example of the embodiment of the present invention.

After that, the device-layer side was cut into a chip a size, and each chip was packaged. Wire bonding may be done from the upper surface side while placing the separated surface on a package board. Alternatively, a chip may be packaged with its upper surface facing down. FIG. 5A shows a schematic view. Reference numeral 510 denotes a package board; 520, an interconnection; 141, trench isolation; 142, a bipolar transistor; 143, well isolation; 144, a PMOS transistor; 145, an NMOS transistor. The trench isolation 141 may reach a separation layer 100.

When a semiconductor device is directly mounted on a plastic card, an IC card can be formed.

Figure 5B:
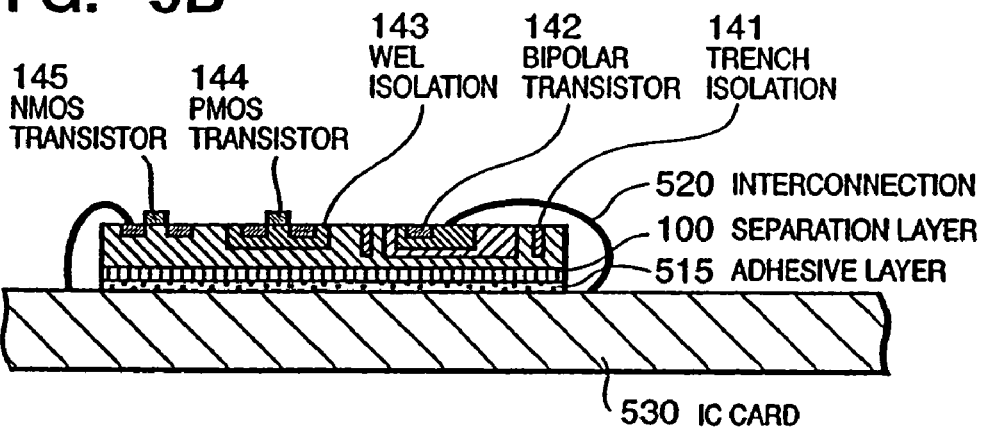
Figure 5C:
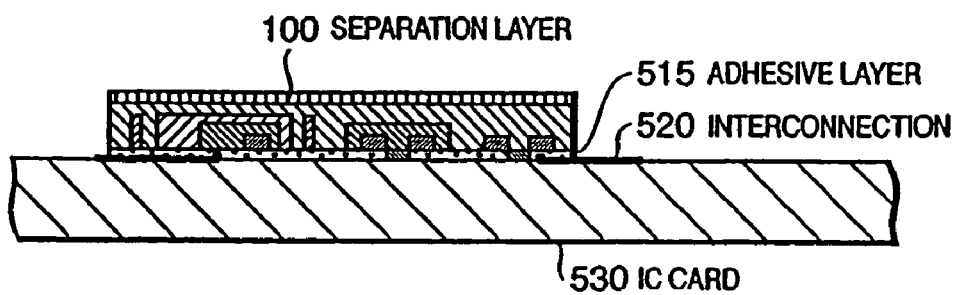
Figure 6A:
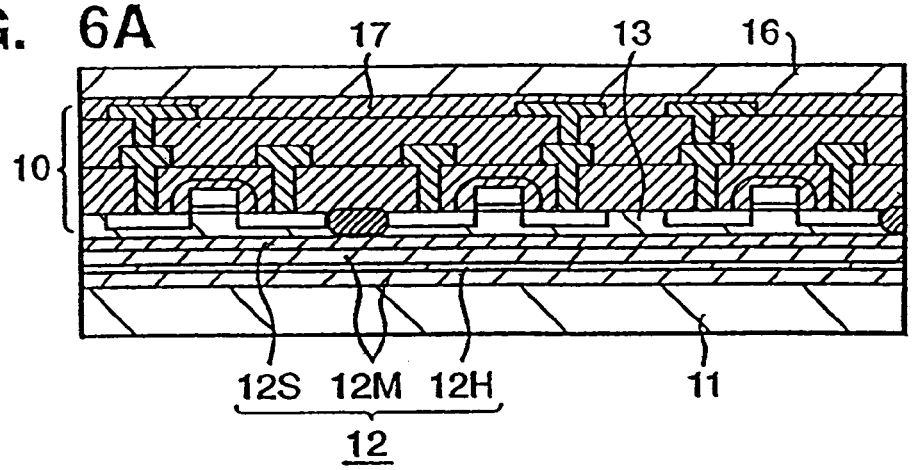
FIGS. 6A to 6C are schematic sectional views showing a prior art.
Figure 6B:
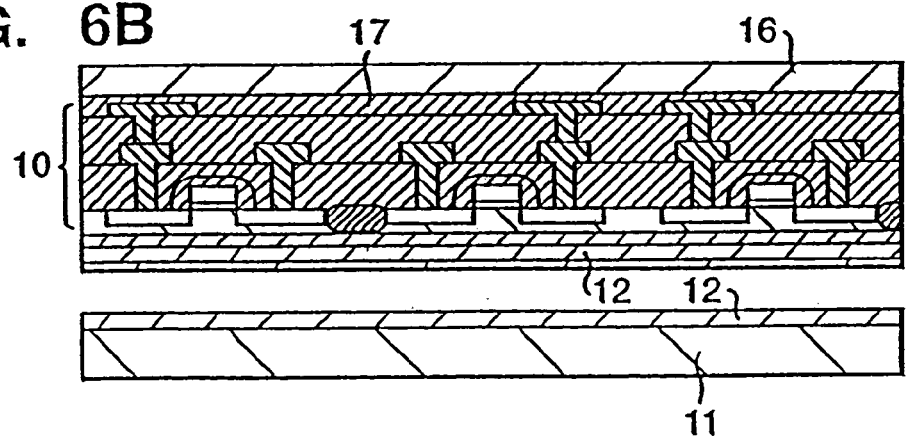
Figure 6C:
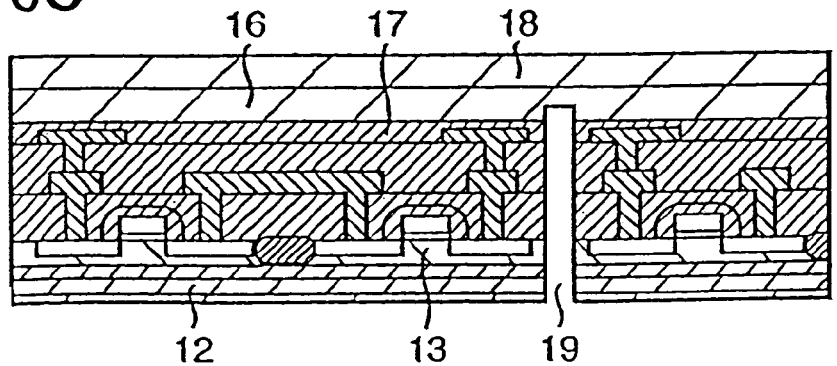

FIG. 5B shows an example in which the device is mounted on an IC card while making the device layer side face upward. FIG. 5C shows an example in which the device layer side faces downward.

When the package board is used as a heat sink, the heat dissipation properties can be greatly improved as compared to a conventional back grinder scheme. Generally, the thickness of the wafer that can be achieved by back-grinding the back surface of the wafer using the back grinder is to a several hundred μm. In the present invention, the "thickness of surface epitaxial layer+thickness of part of porous Si layer (total thickness≦10 μm)". For this reason, the distance between the heat generation source of the device and the heat sink decreases, and the heat dissipation properties greatly improve. OEIC (OptoElectronic Integrated Circuits) may be formed on the epitaxial layer, and the chip may be packaged on a transparent substrate or optical waveguide. In formation a chip, the chip size is preferably 10 cm×10 cm or less, more preferably, 5 cm×5 cm or less, and most preferably 2 cm×2 cm or less.

The single-crystal Si substrate that remained after separation could be re-used in the same process after surface re-polishing, etching, or annealing in an atmosphere containing hydrogen was executed as needed. The substrate may be used for another purpose.

EXAMPLE 2

In Example 1, a single porous layer was used. In Example 2, two porous layers having different porosities were formed.

First, the surface of a silicon substrate was anodized under the following conditions.
  Current density: 8 (mA·cm$^{-2}$)
  Anodizing solution: HF:H$_2$O:C$_2$H$_5$OH=1:1:1
  Time: 5 (min)
  Thickness of porous Si layer: 6 (μm)

Then, anodizing was executed under the following conditions.
  Current density: 33 (mA·cm$^{-2}$)
  Anodizing solution: HF:H$_2$O:C$_2$H$_5$OH=1:1:1
  Time: 80 (sec)
  Thickness of porous Si layer: 3 (μm)

With these processes, a high-porosity layer having a porosity of 45% and a low-porosity layer having a porosity of 20% were formed from the single-crystal silicon substrate side. After that, an epitaxial silicon layer was formed on the low-porosity layer under the same conditions as in Example 1, and an integrated circuit and the like were formed.

After that, water was injected to the porous Si layer to separate the substrate. Separation occurred near the interface between the above-described two porous layers.

The thicknesses of the two porous layers need not always be 6 μm/3 μm. The thicknesses can be changed by changing the anodizing conditions. The anodizing solution need not always be HF:H$_2$O:C$_2$H$_5$OH=1:1:1. Instead of ethanol, another alcohol such as IPA (isopropyl alcohol) may be used. An alcohol serving as a surfactant aims at preventing reactive bubbles from sticking to a wafer surface. Hence, a surfactant other than an alcohol may be used. Alternatively, surface sticking bubbles may be removed by an ultrasonic wave without adding any surfactant.

After separation, the same chip forming step as in Example 1 was performed to manufacture a thin-film semiconductor device.

EXAMPLE 3

A p-type single-crystal Si substrate having a resistivity of 14 Ω·cm was prepared. The plane orientation was <100>. A circuit formation layer for a microprocessor, logic IC, memory, or the like was formed on the surface of the single-crystal Si substrate.

Hydrogen ions were implanted from the circuit formation layer side to a predetermined depth (in Example 3, a depth of 0.5 μm from the surface side), thereby forming an ion-implanted layer. The dose was several $10^{16}$ to $10^{17}$/cm$^2$. Before implantation, a protective film of SiO$_2$ may be formed on the uppermost surface by CVD.

Next, the device formation layer and a plastic substrate (or a glass substrate, Si substrate, flexible film, or adhesive tape) serving as a support member were bonded with an adhesive. After that, nitrogen ions were injected to the side surface of the ion-implanted layer to execute the separation step.

The chip forming step was performed, as in Example 1, to form an IC card.

EXAMPLE 4

A p-type single-crystal Si substrate having a resistivity of 0.01 Ω·cm was prepared. The substrate surface was anodized in an HF solution. The anodizing conditions were
  Current density: 8 (mA·cm$^{-2}$)
  Anodizing solution: HF:H$_2$O:C$_2$H$_5$OH=1:1:1
  Time: 5 (min)
  Thickness of porous Si layer: 6 (μm)

Then, anodizing was executed under the following conditions.
  Current density: 33 (mA·cm$^{-2}$)
  Anodizing solution: HF:H$_2$O:C$_2$H$_5$OH=1:1:1
  Time: 80 (sec)
  Thickness of porous Si layer: 3 (μm)

A high-porosity layer having a porosity of 45% and a low-porosity layer having a porosity of 20% were formed from the single-crystal silicon substrate side. After that, an epitaxial silicon layer was formed on the low-porosity layer under the same conditions as in Example 1, and an integrated circuit and the like were formed. Next, the device layer side was bonded to a plastic substrate (or a glass substrate, Si substrate, flexible film, or adhesive tape) serving as a support member with an adhesive. After that, dicing, i.e., chip formation was performed from an opposite side of the epitaxial layer, i.e., the single-crystal silicon substrate side, thereby separating the substrate into small regions.

Next, while holding each small region by a holding means such as vacuum holders (tweezers), the above-described adhesive was, e.g., melted, as needed, to extract a chip. The chip was mounted on a package board such that the device layer side was used as a bonding surface. After that, a tensile force was applied to separate the substrate at the separation layer. In this way, a thin-film semiconductor device could be formed on the package board. This chip was sealed with a plastic resin to form an IC card.

According to the present invention, the separation step in forming a thin-film semiconductor device is executed using a fluid or executed after a silicon wafer is formed into desired small regions. With this process, a thin-film semiconductor device can be manufactured with a reduced influence on the device formation layer in separation.

As many apparently widely different embodiments of the present invention can be made without departing from the spirit and scope thereof, it is to be understood that the invention is not limited to the specific embodiments thereof except as defined in the appended claims.

What is claimed is:

1. A method of manufacturing a thin-film semiconductor device, comprising:

a step of preparing a member having (a) a semiconductor film with a semiconductor element and/or semiconductor integrated circuit and (b) a separation layer on which the semiconductor film is disposed;

a bonding step of bonding the member to a support member;

a separation step of, after the bonding step, separating the member at the separation layer;

a chip forming step of, after the bonding step, forming the semiconductor film into a plurality of chips;

a packaging step of mounting a chip of the plurality of chips on a package board; and a removing step of, after the separation step, removing the support member.

2. The method according to claim 1, wherein the member is obtained by forming a porous layer on a surface of a semiconductor substrate, forming the semiconductor film on a surface of the porous layer, and then forming the semiconductor element and/or semiconductor integrated circuit.

3. The method according to claim 2, wherein the semiconductor film is formed on the surface of the porous layer after forming a protective film on inner walls of pores in the porous layer.

4. The method according to claim 1, wherein the member is obtained by forming the semiconductor element and/or semiconductor integrated circuit on a surface of a semiconductor substrate and implanting ions from the surface side of the semiconductor substrate to a predetermined depth to form the separation layer.

5. The method according to claim 2, wherein the semiconductor substrate is a single-crystal silicon substrate or a compound semiconductor substrate.

6. The method according to claim 4, wherein the semiconductor substrate is a single-crystal silicon substrate or a compound semiconductor substrate.

7. The method according to claim 1, wherein the separation step is executed by applying the pressure of a fluid to the separation layer.

8. The method according to claim 1, wherein after the separation step, the chip forming step is executed.

9. The method according to claim 1, wherein after the chip forming step, the removing step is executed.

10. The method according to claim 1, wherein after the packaging step, the removing step is executed.

11. The method according to claim 1, wherein the bonding step is executed by bonding the member to the support member via an adhesive.

12. The method according to claim 1, wherein the package board is a heat sink.

* * * * *

UNITED STATES PATENT AND TRADEMARK OFFICE
CERTIFICATE OF CORRECTION

PATENT NO. : 7,029,950 B2  Page 1 of 1
APPLICATION NO. : 11/100605
DATED : April 18, 2006
INVENTOR(S) : Takao Yonehara et al.

It is certified that error appears in the above-identified patent and that said Letters Patent is hereby corrected as shown below:

COLUMN 3
Line 55, "kerf" should read --each kerf--.

Signed and Sealed this

Seventh Day of November, 2006

JON W. DUDAS
*Director of the United States Patent and Trademark Office*